United States Patent
Langer (10) Patent No.: US 9,007,126 B2
(45) Date of Patent: Apr. 14, 2015

(54) MULTI-MODE AMPLIFIER SYSTEM

(71) Applicant: Intel Mobile Communications GmbH, Neubiberg (DE)

(72) Inventor: Andreas Langer, Lohhof (DE)

(73) Assignee: Intel Mobile Communications GmbH, Neubiberg (DE)

( * ) Notice: Subject to any disclaimer, the term of this patent is extended or adjusted under 35 U.S.C. 154(b) by 63 days.

(21) Appl. No.: 13/775,441

(22) Filed: Feb. 25, 2013

(65) Prior Publication Data

US 2014/0240040 A1 Aug. 28, 2014

(51) Int. Cl.
*H03G 3/20* (2006.01)
*H03G 3/00* (2006.01)

(52) U.S. Cl.
CPC .................................. *H03G 3/004* (2013.01)

(58) Field of Classification Search
CPC ............................ H03F 1/0211; H03F 1/0216
USPC .................................. 330/127, 133, 136, 297
See application file for complete search history.

(56) References Cited

U.S. PATENT DOCUMENTS

| 4,277,757 | A | 7/1981 | Kennedy |
| 6,741,127 | B2 * | 5/2004 | Sasho et al. .................... 330/136 |
| 7,193,473 | B2 | 3/2007 | Pengelly et al. |
| 7,508,264 | B1 | 3/2009 | Terrovitis |
| 8,659,355 | B2 * | 2/2014 | Henshaw et al. ............. 330/127 |

* cited by examiner

*Primary Examiner* — Steven J Mottola
(74) *Attorney, Agent, or Firm* — Eschweiler & Associates, LLC (57) ABSTRACT

A multi-mode amplifier system includes a supply converter and a multi-stage amplifier. The supply converter is configured to generate a plurality of varied supply signals according to an output power mode. The multi-stage amplifier is configured to generate an RF output signal from an RF input signal according to the varied supply signals.

19 Claims, 5 Drawing Sheets

MULTI-MODE AMPLIFIER SYSTEM

BACKGROUND

Power amplifiers are present in wireless communication systems. Power amplifiers receive a modulated input signal and amplify the signal, which is provided as an amplified output signal.

The power amplifiers are selected and/or designed for communication systems according to several properties including, but not limited to, gain, linearity, and power consumption. Generally, the lowest possible power consumption is desired. However, lower power consumption may lead to lower gain and/or lower linearity.

One technique used to mitigate power consumption in wireless communication systems is to utilize average power tracking. For this technique, a supply voltage to a power amplifier is adjusted according to an average power of a next slot. Other similar techniques can be employed. These techniques represent an improvement compared with simply supplying a static supply voltage. However, additional improvements in reduced power consumption are needed.

DETAILED DESCRIPTION

The present invention will now be described with reference to the attached drawing figures, wherein like reference numerals are used to refer to like elements throughout, and wherein the illustrated structures and devices are not necessarily drawn to scale.

Systems and methods are disclosed that provide a multi-stage amplifier using a plurality of modes in order to increase efficiency and reduce power consumption while maintaining selected gain and linearity characteristics.

Figure 1:
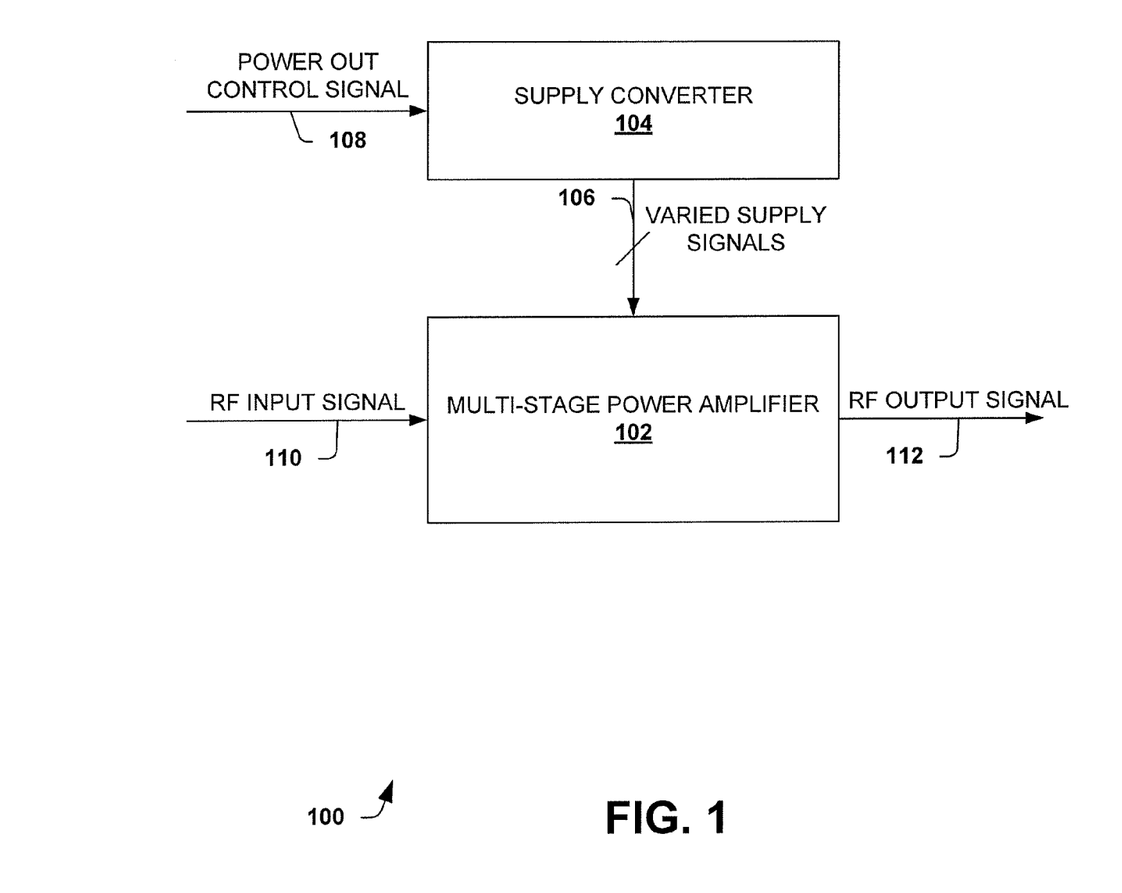
FIG. 1 is a block diagram illustrating a power amplifier system 100 that facilitates efficiency without substantially impacting hardware complexity.

FIG. 1 is a block diagram illustrating a power amplifier system 100 that facilitates efficiency without substantially impacting hardware complexity. The system 100 uses one or more varied supply signals to facilitate performance and mitigate power consumption. The supply signals are selectively utilized by multiple amplifier stages.

The system 100 includes a supply converter 104 and a multi-stage power amplifier 102. The multi-stage power amplifier 102 includes a plurality of amplifier stages including a first stage and a last stage. The stages are connected in series.

The amplifier 102 receives an RF input signal 110 and generates an RF output signal 112. The amplifier 102 amplifies the input signal according to a selected gain and linearity. The amplifier 102 also receives a plurality of varied supply signals 106 for the plurality of amplifier stages. More than one stage can utilize each of the varied supply signals 106.

The supply converter 104 receives a power output control signal 108 and generates and/or modulates the varied supply signals 106 according to the control signal 108. The supply converter 104 is configured to utilize multiple supply voltage generation/modulation techniques. For example, the techniques may include batter power supply, average power tracking, envelope tracking, constant voltage, buck converter use and the like.

The supply converter 104 operates having a plurality of modes, including a high power mode, medium power mode and a low power mode. The mode is selected using the power out control signal 108. In the low power mode, a low power set of supply signals are supplied as the supply signals 106. In the high power mode, a high power set of supply signals are supplied as the supply signals 106. The low and high power sets are generated using one or more of the supply voltage generation techniques. In one example, the high power mode is at output power values greater than about 10-20 dBm, the medium power mode is at values between about 5-20 dBm, and the low power mode is at values less than about 10 dBm. However, it is appreciated that ranges for the modes may vary according to criteria, such as selected efficiency, and the like.

The battery power supply technique is provided by merely connecting to a battery. As there is no DC to DC conversion, the supply is efficient. The battery power supply is typically used in the high power mode and is provided to a first stage of the amplifier 102.

The average power tracking (APT) is a technique that supplies power based on a target power or average power for a next slot or time period. The average power information can be provided by a baseband component and the like and is obtained via the power out control signal 108. During the slot or time period for APT, the supply voltage remains constant. The supply voltage changes when a next average power or target power value varies from a current value. The APT technique is typically used for first and last stages for the low power mode.

Envelope tracking (ET) is a technique where the applied supply voltage is constantly adjusted according to given instantaneous output power requirements. Thus, the supply voltage tracks a power envelope of an RF signal. The supply voltage is not constant and depends on an instantaneous envelop of a modulated baseband signal or RF input signal (such as input 110). The envelope is calculated using a suitable mechanism, such as a CORDIC algorithm, followed by a delay adjustment. Using ET can reduce power consumption by at least 20% over APT, in some examples. The ET technique is typically used for last stages or upper stage in the high power mode.

A constant voltage is a technique where a converter or modulator supplies a relatively constant voltage as a supply voltage. For example, a buck converter can be utilized to generate a supply voltage at a constant value.

The varied supply signals 106 are directed to the plurality of amplifier stages by the supply converter 104. As shown above, the supply converter 104 generates supply voltages using the techniques and directs the supply voltages to the stages according to the mode. In one example, the supply converter 104 includes a switch mechanism that selectively provides the supply voltages to the plurality of stages. In another example, the power amplifier 102 includes a switch mechanism that selectively provides the supply voltage to the plurality of stages. The switch mechanism is controlled by the converter 104. In yet another example, a switch mechanism is located external to both the converter 104 and the power amplifier 102.

Figure 2:
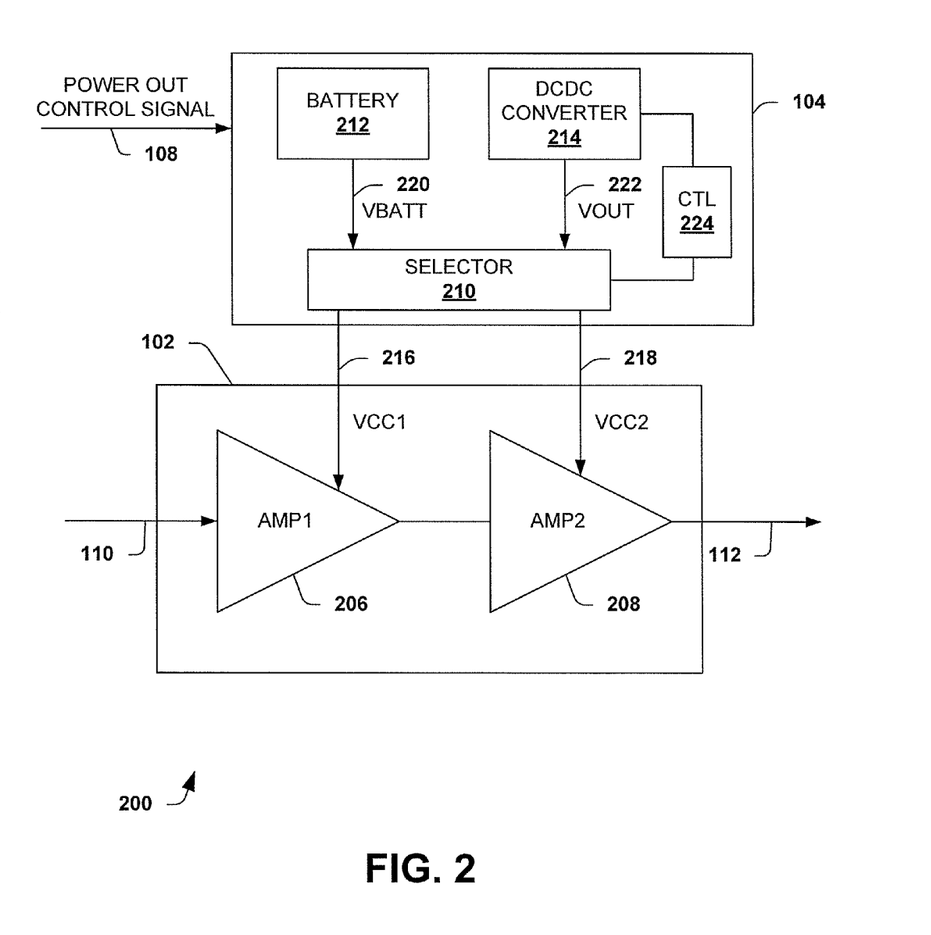
FIG. 2 is a diagram illustrating a two stage power amplifier system 200.

FIG. 2 is a diagram illustrating a two stage power amplifier system 200. The system 200 uses a battery supply and converter supply to selectively power first and second stages according to a mode of operation. The system 200 is provided in more detail than the system 100, above.

The system 200 includes a multi-stage power amplifier 102 and a supply converter 104, which are also described above. The power amplifier 102 includes a first stage 206 and a second stage 208. The amplifier 102 receives an RF input signal 110 and generates an RF output signal 112. The first stage 206 is supplied by a first supply signal 216 (VCC1) and the second stage 208 is supplied by a second supply signal 218 (VCC2).

The supply converter 104 includes a battery supply 212, a DCDC converter 214, a supply controller 224 and a selector mechanism 210. The supply converter 104 receives a control signal 108, selects a mode of operation based on the control signal 108, and generates the first supply signal 216 and the second supply signal 218 according to the selected mode of operation.

The battery supply 212 is configured to generate a battery supply voltage 220 (VBATT) and the DCDC converter 214 is configured to generate a converter supply voltage 222 (VOUT). The battery supply voltage 220 is typically relatively higher than the converter supply voltage 222. The battery supply voltage 220 may be provided by merely connected to an internal battery. Further, the battery supply 212 generates the battery supply voltage 220 without performing DC to DC conversions.

The DCDC converter 214, also referred to as a modulator, operates using a plurality of supply generation techniques to provide the converter supply voltage 222. One technique is average power tracking and another technique is envelope tracking.

The average power tracking (APT) technique supplies power based on a target power or average power for a next slot or time period. The average power information can be provided by a baseband component and the like and is obtained via the power out control signal 108. During the slot or time period for APT, the supply voltage remains constant. The supply voltage changes when a next average power or target power value varies from a current value.

The envelope tracking (ET) technique generates a constantly varying and adjusted supply voltage generated according to given instantaneous output power requirements. Thus, the supply voltage tracks a power envelope of an RF signal. The supply voltage is not constant and depends on an instantaneous envelope of another signal, such as a modulated baseband signal or RF input signal (such as input 110). The envelope is calculated using a suitable mechanism, such as a CORDIC algorithm, followed by a delay adjustment. In some example, using ET can reduce power consumption by at least 20% over APT.

Generally, the DCDC converter 214 uses the APT technique for a low power mode and uses the ET technique for a high power mode. The converter 104 selects the mode according to the power out control signal 108.

The selector 210 directs one of the battery supply voltage 220 and the DCDC converter voltage 222 to the first supply voltage 216 according to the mode. Additionally, the selector 210 also directs one of the DCDC converter voltage 222 to the second supply voltage 218 according to the mode. For example, in a high power mode, the selector 210 directs the battery supply voltage 220 to the first supply voltage 216 and directs the DCDC converter voltage 222 to the second supply voltage 218. In a low power mode, the selector 210 directs the DCDC converter voltage 222 to both the first supply voltages 216 and the second supply voltage 218.

The selector 210 includes a suitable mechanism for selecting and directing the DCDC converter voltage 222 and the battery voltage 220 to the first and second supply signals 216 and 218. The mechanism can include, for example, one or more switches operated by a general purpose input output (GPIO).

The supply controller 224 is coupled to the DCDC converter 214 and the selector 210. The controller 224 selects or identifies a mode of operation and controls the DCDC converter 214 and the selector 210 according to the identified mode. The controller 224 selects or identifies the mode based on information of the power out control signal 108 and/or other signals. This information may include current output power, average output power of a next time period or slot, and the like. The information may include the RF input signal 110, the RF output signal 112, signals from a baseband component, and the like. In one example, the controller 224 selects a high power mode on an average power of a next slot being at least a threshold value. In another example, the controller 224 selects a low power mode on an average power of a next slot being less than the threshold value. The threshold value may vary according to criteria, such as power mode and power efficiency. Some examples of suitable threshold values are included in the range 10 to 20 dBm.

The supply controller 224 may also generate or modify the first and second supply signals 216 and 218 with bias currents. The modified currents or bias currents can be provided in order to compensate for variations, such as temperature variations. In one example, the bias currents are provided separately from the supply signals 216 and 218.

As stated above, the power amplifier 102 includes the first stage 206 and the second stage 208. The first stage 206 is powered by the first supply signals 216 and the second stage is powered by the second supply signal 218. The content of the supply signals 216 and 218 varies according to the mode of operation.

The first stage 206 receives the RF input signal 110 and amplifiers the signal, which is provided at its output. The second stage 208 receives the output from the first stage and amplifies its input and provides the RF output signal 112 at its output.

Other conventional amplifier systems utilize first and second stage amplifiers and use envelope tracking. However, these systems utilize envelope tracking for supply power for both stages. As a result, noise and amplifier stability can be impacted. This may be due to necessary removal of large bypass capacitors to lower capacitance loading of a converter utilizing envelope tracking.

Another conventional approach is to use envelope tracking for supply power for a second stage, but to use battery power for the first stage. This permits the first stage to be designed for noise and stability without considering envelope tracking specific design constraints. This type of system has acceptable efficiencies at high power operation, but yields relatively poor efficiencies at lower power. The lower efficiency is due to the battery power.

The system 200 utilizes multiple modes including the high power mode and the low power mode. The system 200 tailors supply voltages to stages of the amplifier 102 in order to mitigate power consumption while maintaining selected or acceptable amplifier parameters, such as gain and linearity.

Figure 3:
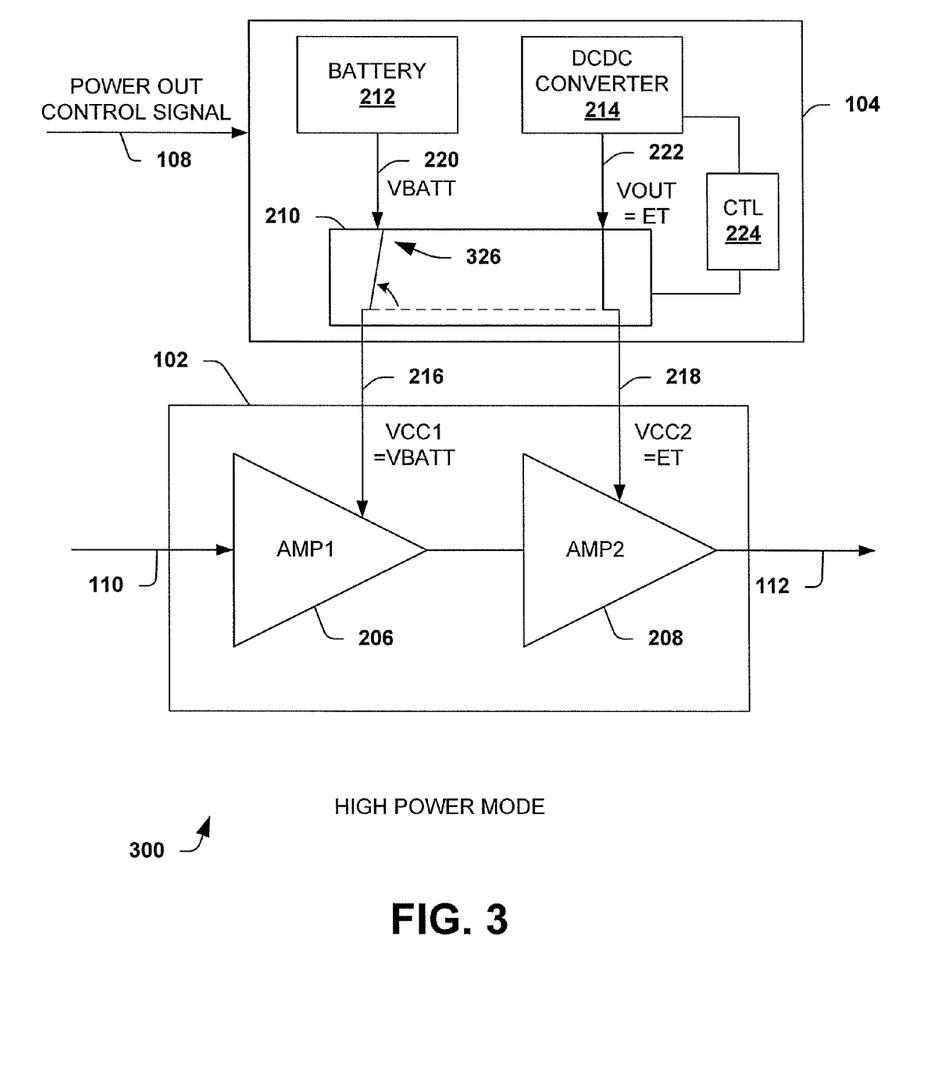
FIG. 3 is a diagram illustrating a two stage power amplifier system 300 operating in a high power mode.
Figure 4:
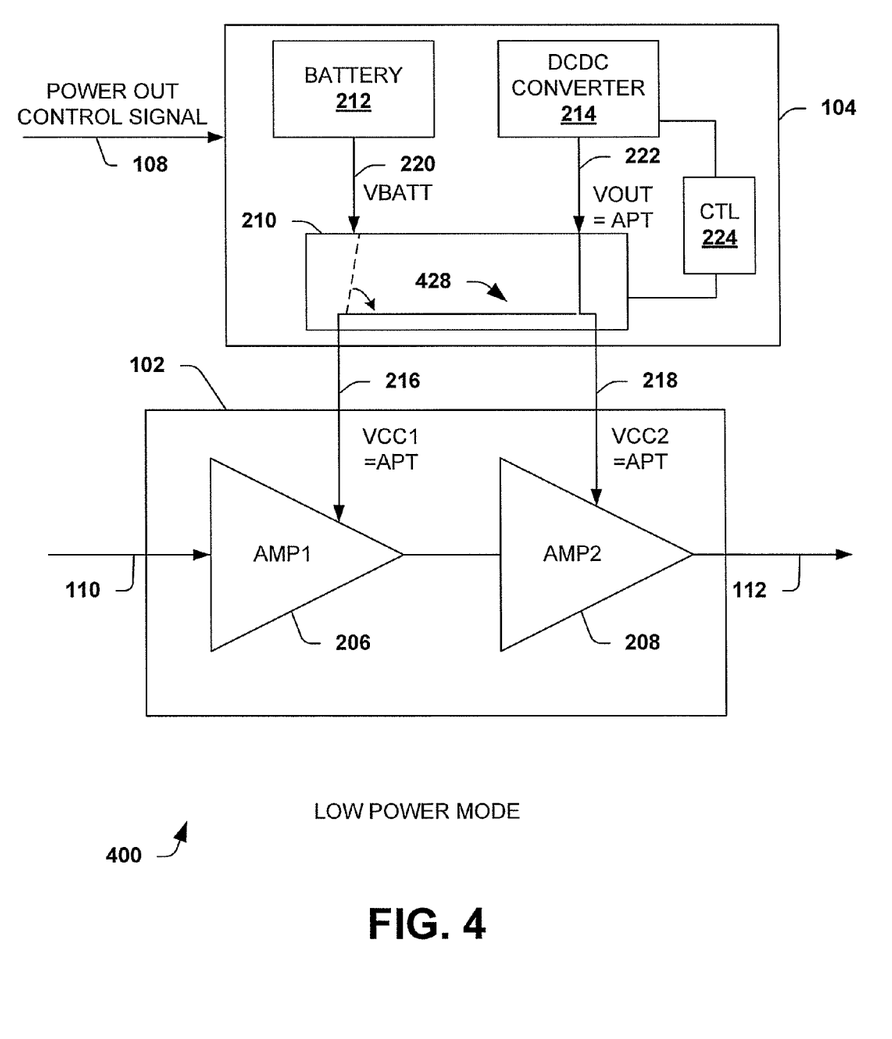
FIG. 4 is a diagram illustrating a two stage power amplifier system 300 operating in a low power mode.

FIGS. 3 and 4 are described next and are examples illustrating the system 200 operating in high and low power modes. It is appreciated that other modes and/or configurations can be utilized than are described below.

FIG. 3 is a diagram illustrating a two stage power amplifier system 300 operating in a high power mode. The system 300 is substantially similar to system 200, described above. For additional description of similar components, reference the description provided for the system 200.

The high power mode system 300 includes a multi-stage power amplifier 102 and a supply converter 104. The power amplifier 102 includes a first stage 206 and a second stage. The amplifier 102 receives an RF input signal 110 and generates an RF output signal 112. The first stage 206 is supplied by a first supply signal 216 (VCC1) and the second stage 208 is supplied by a second supply signal 218 (VCC2).

The supply converter 104, in this example, includes a battery supply 212, a DCDC converter/modulator 214, a supply controller 224 and a selector mechanism 210. The supply converter 104 receives a control signal 108, selects a mode of operation based on the control signal 108, and generates the first supply signal 216 and the second supply signal 218 according to the selected mode of operation, which is high power in this example.

The battery supply 212 is configured to generate a battery supply voltage 220 (VBATT) and the DCDC converter 214 is configured to generate a converter supply voltage 222 (VOUT). The battery supply voltage 220 is typically a direct or indirect connection to an internal battery and has time varying characteristics depending on factors including, but not limited to, temperature, depth of discharge, and the like. Further, the battery supply 212 generates the battery supply voltage 220 without performing DC to DC conversions.

The DCDC converter 214, also referred to as a modulator, operates using a plurality of supply generation techniques to provide the converter supply voltage 222. Examples of suitable techniques include average power tracking and envelope tracking. Here, the converter 214 uses envelope tracking to generate the converter supply voltage 222.

In this example, the system 300 is operating in high power mode. The high power mode is based on the expected or current output power. In one example, the high power mode corresponds to an output power greater than a threshold value, as described above.

The selector mechanism 210 is shown in this example with a switch set to a first position 326, which corresponds to the high power mode. The controller 224 operates the switch. The first position 326 couples the first supply signal 216 to the battery supply 220. The first supply signal 216 is provided to the first stage 206. The first position also connects the converter supply voltage 222 to the second supply signal 218. The second supply signal 218 is provided to the second stage 208.

In the high power mode, the DCDC converter 214 utilizes envelope tracking (ET) to generate and/or modulate the converter supply voltage 222. As stated above, the envelope tracking (ET) technique generates a constantly varying and adjusted supply voltage generated according to given instantaneous output power requirements. The power requirements can be obtained from the power out control signal 108, the input RF signal 110, the output RF signal 112, and the like. Also, unlike average power tracking (APT), the supply voltage varies during a slot.

As a result, the first stage 206 is supplied with the battery supply voltage 220 and the second stage 208 is supplied with the converter voltage 222. For the high power mode, the converter voltage 222 is generated using envelope tracking technique, thus the second stage 208 operates with power using the envelope tracking technique.

FIG. 4 is a diagram illustrating a two stage power amplifier system 300 operating in a low power mode. The system 400 is substantially similar to systems 200 and 300, described above. For additional description of similar components, reference the description provided for the system 200.

In this example, the system 400 is operating in low power mode. The low power mode is based on the expected or current output power. In one example, the low power mode corresponds to an output power less than the threshold value, such as 10-20 dBm.

The selector mechanism 210 is shown in this example with the switch set to a second position 428, which corresponds to the low power mode. The second position 428 couples both the first supply signal 216 and the second supply signal 218 to the converter supply voltage 222. It is noted that the battery supply 212 is disconnected from the first and second supply signals 216 and 218.

In this example using the low power mode, the DCDC converter 214 generates the converter supply voltage 222 using an average power tracking (APT) technique. Using the APT technique generates a constant voltage for a slot based on an average expected power for the slot.

As a result, the first stage 206 and the second stage 208 are supplied with the same converter voltage 222. Here, the converter voltage is generated using the APT technique. Thus, the system 400 is thus configured to generate the RF output signal 112 with the selected linearity and gain, while mitigating power consumption in the low power mode.

It is appreciated that the modes and the selector mechanism 210 are shown with example modes and configurations in order to facilitate understanding. It is appreciated that other modes, ranges, and mechanisms can be utilized.

Figure 5:
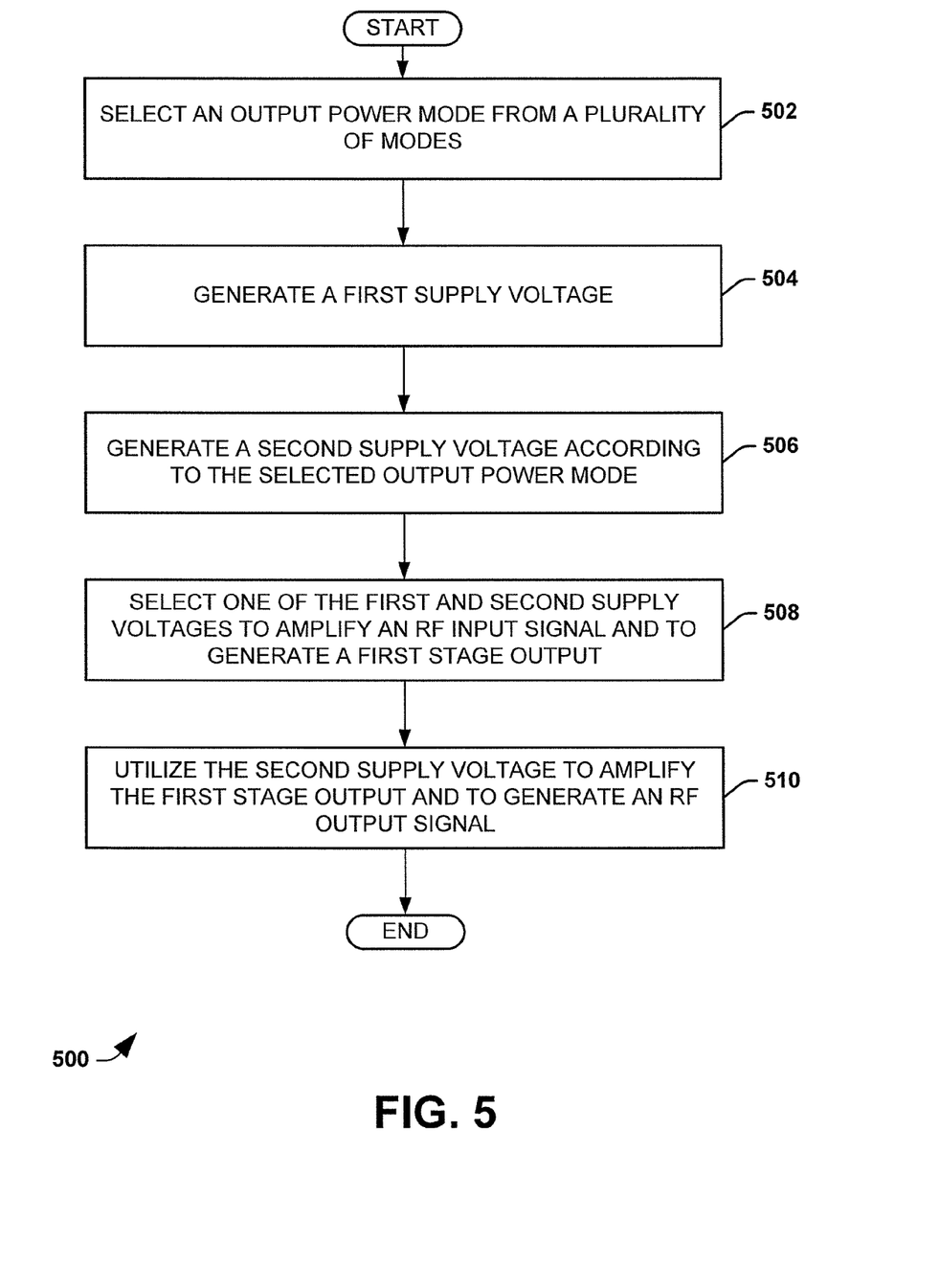
FIG. 5 is a flow diagram illustrating a method of operating a multi-mode amplifier.

FIG. 5 is a flow diagram illustrating a method 500 of operating a multi-mode amplifier. The method 500 selects and utilizes an output power mode to generate an RF output signal. The method 500 generates the signal according to the output power mode while providing selected gain and linearity and mitigating power consumption.

The method 500 begins at block 502, where an output power mode is selected. The mode is selected from a plurality of possible modes including, for example, a high power mode, a medium power mode, a low power mode, and the like. The mode is selected by analyzing a signal, such as, an RF input signal, an RF output signal, a power out control signal, and the like.

A first supply voltage is generated at block 504. The first supply voltage can include a constant voltage or a time varying voltage. In one example, the first supply voltage is generated by using a battery. In another example, the first supply voltage is generated using a buck converter.

A second supply voltage is generated at block 506. The second supply voltage is generated according to the output power mode. Thus, the second supply voltage can vary according to the output power mode. For example, the second supply voltage may be generated using an average power tracking technique for a high output power mode. As another example, the second supply voltage may be generated using an envelope tracking technique for a low output power mode.

One of the first supply voltage and the second supply voltage are selected at block 508 to amplify an RF input signal and to generate a first stage output signal. The supply voltage is selected according to the output power mode. Thus, in one mode, the first supply voltage is used while in a second mode, the second supply voltage is used.

A suitable selection mechanism can be utilized to select the supply voltage. In one example, a general purpose input output is connected to a switch to controllably select one of the supply voltages.

The second supply voltage is used to amplify the first stage output signal and to generate an RF output signal at block 510. The RF output signal can then be utilized for transmission and the like.

As shown, the method 500 utilizes multiple modes including, a high power mode and a low power mode, to generate supply signals and to generate an RF output signal. The method 500 mitigates power consumption while maintaining selected or acceptable amplifier parameters, such as gain and linearity.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A multi-mode amplifier system includes a supply converter and a multi-stage amplifier. The supply converter is configured to generate a plurality of varied supply signals according to an output power mode. The multi-stage amplifier is configured to generate an RF output signal from an RF input signal according to the varied supply signals.

A multi-mode amplifier system includes a battery supply, a converter, a selector, a first stage of an amplifier, and a second stage of the amplifier. The battery supply is configured to provide a battery supply voltage. The converter is configured to provide a converter supply voltage. The selector is coupled to the battery supply and converter. The selector is configured to provide a first supply voltage and a second supply voltage from the battery supply voltage and/or the converter supply voltage according to the output power mode. The first stage of the amplifier is configured to receive an RF incoming signal and to generate the first stage output signal using the first supply voltage. The second stage of the amplifier is configured to receive the first stage output signal and to generate an RF output signal using the second supply voltage.

A method of operating a multi-mode amplifier is disclosed. A first supply voltage is generated. A second supply voltage is generated according to an output power mode. One of the first and second supply voltages is selected according to the output mode in order to generate a first stage output signal. The second supply voltage is used to amplify the first stage output signal and to generate an RF output signal.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A multi-mode amplifier system, the system comprising:
a supply converter configured to generate a plurality of varied supply signals according to an output power mode, wherein the plurality of varied supply signals include a battery supply voltage and a converter supply voltage; and
a multi-stage amplifier configured to generate an RF output signal from an RF input signal according to the varied supply signals, wherein the multi-stage amplifier includes a first stage and a second stage, wherein the first stage receives a first supply signal of the varied supply signals, wherein the second stage receives a second supply signal of the varied supply signals, and wherein the second supply signal is different than the first supply signal.

2. The system of claim 1, wherein the supply converter is further configured to receive a power out control signal and to select the output power mode from a plurality of modes according to the power out control signal.

3. The system of claim 1, wherein the supply converter is configured to generate the converter supply voltage using average power tracking on the output power mode being a low or medium output power.

4. The system of claim 1, wherein the supply converter is configured to generate the converter supply voltage using envelope tracking on the output power mode being a high output power.

5. The system of claim 1, wherein the multi-stage amplifier includes more than two stages.

6. The system of claim 1, wherein the first stage and the second stage are coupled in series.

7. The system of claim 6, wherein the second stage receives the second supply signal of the varied supply signals according to the output power mode.

8. A multi-mode amplifier system, the system comprising:
a supply converter configured to generate a plurality of varied supply signals according to an output power mode; and
a multi-stage amplifier configured to generate an RF output signal from an RF input signal according to the varied supply signals, wherein the multi-stage amplifier includes a first stage and a second stage, wherein the first stage receives a first supply signal of the varied supply signals, wherein the second stage receives a second supply signal of the varied supply signals, and wherein the second supply signal is different than the first supply signal, wherein the first supply signal corresponds to a battery voltage supply and the second supply signal corresponds to an envelope tracking converter supply voltage.

9. The system of claim 7, wherein the second supply signal corresponds to an average power tracking supply voltage.

10. The system of claim 1, wherein the output power mode is selected from a low power mode, a medium power mode, and a high power mode.

11. The system of claim 1, wherein the supply converter is configured to generate bias currents for the multi-stage amplifier according to a temperature.

12. A multi-mode amplifier system, the system comprising:
   a battery supply configured to provide a battery supply voltage;
   a converter configured to provide a converter supply voltage;
   a selector coupled to the battery supply and the converter, wherein the selector is configured to provide a first supply voltage and a second supply voltage from the battery supply voltage and the converter supply voltage according to an output power mode;
   a first stage of an amplifier configured to receive an RF incoming signal and to generate a first stage output signal using the first supply voltage; and
   a second stage of the amplifier configured to receive the first stage output signal and to generate an RF output signal using the second supply voltage, wherein the second supply voltage is different than the first supply voltage.

13. The system of claim 12, further comprising a controller coupled to the converter and the selector, wherein the controller is configured to select the output power mode.

14. The system of claim 13, wherein the controller receives a power out control signal.

15. The system of claim 12, wherein the selector is configured to provide the battery supply as the first supply voltage and the converter supply voltage as the second supply voltage on the output power mode being a high power mode.

16. The system of claim 12, wherein the selector is configured to provide the converter supply voltage as the second supply voltage.

17. The system of claim 12, wherein the converter is configured to utilize an average power tracking technique on the output power mode being a first value and to utilize an envelope tracking technique on the output power mode being a second value, varied from the first value.

18. A method of operating a multi-mode amplifier, the method comprising:
   generating a first supply voltage, wherein the first supply voltage is a battery voltage;
   generating a second supply voltage according to an output power mode, wherein the second supply voltage is different than the first supply voltage;
   selecting one of the first supply voltage and the second supply voltage to amplify an input signal according to the output power mode and to generate a first stage output signal; and
   using the second supply voltage to amplify the first stage output signal and to generate an RF output signal.

19. The method of claim 18, further comprising selecting the output power mode for a plurality of modes according to a power out control signal.

* * * * *